United States Patent [19]

Tsukada et al.

[11] Patent Number: 4,968,374
[45] Date of Patent: Nov. 6, 1990

[54] PLASMA ETCHING APPARATUS WITH DIELECTRICALLY ISOLATED ELECTRODES

[75] Inventors: Tsutomu Tsukada; Toshio Tamaki; Tatsuhiko Yoshida, all of Fuchu, Japan

[73] Assignee: Anelva Corporation, Tokyo, Japan

[21] Appl. No.: 359,817

[22] Filed: Jun. 1, 1989

[30] Foreign Application Priority Data

Jun. 9, 1988 [JP] Japan .................. 63-142629

[51] Int. Cl.$^5$ .................................. C23F 1/02
[52] U.S. Cl. .................................. 156/345; 156/643; 204/298.31
[58] Field of Search .................. 156/345, 643; 204/298 E, 298 EP, 192.32, 298.31, 298.34

[56] References Cited

U.S. PATENT DOCUMENTS

| | | | |
|---|---|---|---|
| 4,399,016 | 8/1983 | Tsukada et al. | 156/345 |
| 4,400,235 | 8/1983 | Coquin et al. | 204/192.32 |
| 4,482,419 | 11/1984 | Tsukada et al. | 156/345 |
| 4,579,618 | 4/1986 | Celestino et al. | 156/345 |
| 4,585,920 | 4/1986 | Hoog et al. | 204/298 |
| 4,793,975 | 12/1988 | Drage | 204/298 |

FOREIGN PATENT DOCUMENTS

| | | | |
|---|---|---|---|
| 54-157645 | 7/1981 | Japan | 156/345 |
| 59-134832 | 8/1984 | Japan | 156/345 |
| 60-201632 | 10/1985 | Japan | 156/345 |
| 62-47130 | 2/1987 | Japan | 156/345 |
| 62-239521 | 10/1987 | Japan | 156/345 |

Primary Examiner—Kenneth M. Schor
Assistant Examiner—John J. Bruckner
Attorney, Agent, or Firm—Pollock, Vande Sande & Priddy

[57] ABSTRACT

A dry etching apparatus has a vacuum chamber provided therein with an RF electrode. On the RF electrode an object substrate(s) is placed. The RF electrode is covered with a substrate bed(s) and detachable dielectric members. The substrate bed(s) includes a dielectric portion and a conductive portion provided just under the dielectric portion. The conductive portion is equipotential in terms of direct current to the RF electrode. At least one gap extension is consituted of a gap(s) between the dielectric members, a gap(s) between the dielectric members and the substrate bed(s), etc. and extends from the surface of the RF electrode to the plasma space. The gap extension(s) extends zigzaggedly from the RF electrode to the plasma space so that the plasma space can not structurally be viewed from the surface of the RF electrode irrespective the dimesions of the substrate. To the RF electrode is applied a negative DC voltage having larger absolute value than that of a negative self-bias voltage at the object substrate(s) induced by plasma discharge.

5 Claims, 5 Drawing Sheets

PLASMA ETCHING APPARATUS WITH DIELECTRICALLY ISOLATED ELECTRODES

BACKGROUND OF THE INVENTION

1. Field of the Invention

The present invention relates to a dry etching apparatus for etching substrates such as silicon substrates for producing semiconductor integrated circuits by utilizing a gas plasma generated by radiofrequency glow discharge.

2. Description of the Prior Art

Dry etching apparatuses for etching object substrates (hereinafter referred to in brief as "substrates") by utilizing radiofrequency glow discharge are widely used in the field of production of semiconductor integrated circuits These dry etching apparatuses usually have a structure comprising a vacuum chamber provided therein with an RF electrode, to which a radiofrequency voltage is to be applied, and with a grounding electrode between which and the RF electrode a plasma is to be generated. Various etching systems are respectively employed in these dry etching apparatuses. Increasingly used in various processes for producing semiconductor devices, since they are capable of anisotropic etching and excellent in mass productivity are reactive ion etching (RIE) apparatuses wherein etching is effected while a substrate is placed on an RF electrode.

The early models of RIE apparatuses have a structure wherein an object substrate having thereon an etching mask made of a photoresist is merely placed on an RF electrode (or a substrate bed disposed thereon). This structure allows the substrate to be readily heated by a plasma to a high temperature, thereby causing thermal damage to the photoresist of the etching mask and deterioration of the etching pattern. Therefore, this structure is defective in that improving the etching rate and controlling the etching pattern as desired are difficult.

In view of the above, there have been proposed some methods of keeping a substrate at a desirable low temperature during an etching treatment. One of the methods mechanically clamps a substrate on an RF electrode (or a substrate bed disposed thereon) to improve the thermal contact therebetween to thereby keep the temperature of the substrate low. Another method involves passing a gas such as He between the reverse surface of a substrate and the upper surface of a substrate bed to enhance heat dissipation from the substrate to thereby keep the temperature of the substrate low. Yet another method (electrostatic chucking) provides a DC electrode under a substrate bed (or an RF electrode) to produce therewith an electrostatic force which brings a substrate into close contact with the substrate bed or (the RF electrode) to improve heat transfer therebetween to thereby keep the temperature of the substrate low. Particularly, since the last-mentioned electrostatic chucking method involves a relatively simple structure and provides a large cooling effect, various systems for realizing electrostatic chucking have been proposed.

For example, Japanese Patent Publication No. 53,853/1981 (Japanese Patent Laid-Open No. 90,228/1980) discloses a "dry etching apparatus" wherein the electrostatic chucking method is employed through utilization of the electrical conductivity of a gas plasma. According to this conventional system, an RF electrode and a gas plasma serve as electrodes sandwiching a dielectric film therebetween not only to make the system simple but also to minimize the damage to a substrate. Further, according to this system, an electrostatic chucking force is exerted only during the existence of the gas plasma to facilitate chucking and unchucking of the substrate. Thus, this system for electrostatic chucking is very effective. FIG. 1 is a schematic cross-sectional view of the structure of the dry etching apparatus disclosed in the above-mentioned publication. The structure of FIG. 1 comprises a radiofrequency power source 101, an RF electrode 102, substrates 103, a counter electrode 104, and a dielectric film 105 on which the substrates 103 to be electrostatically chucked are placed. The structure of FIG. 1 further comprises an insulator 106, a DC power source 107, a radiofrequency cutoff circuit 108, a radiofrequency matching circuit 109, a conductive rubber sheet 110 provided on the RF electrode 102, a plasma 111, cooling system 112 for the RF electrode 102, a vacuum chamber 113, a pumping system 114, and a gas feed system 115. The above-mentioned components 101 to 115 of the structure are all well known in the art, and hence the detailed description thereof is omitted.

However, various problems arose when etching was effected with dry etching apparatuses of the kind as described above In the case of a batch type dry etching apparatus comprising an RF electrode 102 having an oversized (in area) upper surface for the purpose of carrying out a blanket etching treatment of a plurality of substrates where a conductive rubber sheet 110 provided all over the broad upper surface of the RF electrode 102, a it is very difficult to cover the entire surface of the rubber sheet 110 exposed in vacuum chamber 113 with a dielectric film 105 such that the latter would be in perfect close contact with the former without leaving spaces therebetween. Even if the above-mentioned entire surface of rubber sheet 110 can be covered with dielectric film 105 without leaving spaces therebetween, small spaces do develop between the dielectric film 105 and the rubber sheet 110 when the vacuum chamber 113 is evacuated to a high degree of vacuum. Thus, when plasma is generated, abnormal discharge would occur in these small spaces, thereby not only causing failure in the electrostatic chucking but also destroying the dielectric film 105 and/or DC power source 107.

Usually, substrate 103 is electrostatically chucked by an electrostatic force produced by a potential difference between a negative self-bias voltage of several hundreds volts induced in substrate 103 during etching and a DC voltage applied to RF electrode 102 and, hence, to conductive rubber sheet 110 provided thereon. Accordingly, a positive DC voltage of about 1 kV is applied from a DC power source 107 to RF electrode 102. The aforementioned abnormal discharge results from such applied voltage of about 1 kV, which, during plasma discharge, forces electrons in the plasma to flow through the small spaces as mentioned above into the RF electrode 102 to cause abnormal discharge.

Even when the DC voltage for electrostatic chucking is reversed from a positive polarity to a negative polarity, such abnormal discharge occurs as well. In this case, ions would flow into the above-mentioned small spaces.

In order to avoid the occurrence of such abnormal discharge, the inventors of the present invention proposed an apparatus as shown in FIG. 2 (Japanese Patent Laid-Open No. 149,734/1982). In this apparatus, a plurality of substrate beds (supports) 214 are provided on an RF electrode 213 having a surface covered indirectly with a shield panel 211 and directly with a dielectric electrode cover 212. Electrodes 217 each covered with a dielectric film 215 and insulated from the RF electrode 213 with a dielectric layer 216 provided therebetween are embedded only just under the corresponding substrate beds 214. A DC voltage is applied from a DC power source 218 through a radio frequency filter 219 only to these electrodes 217. The apparatus further comprises substrates 220, a counter electrode 221, an insulator 222, a radio frequency power source 223, a radio frequency cutoff circuit 224, a cooling system 225, a vacuum chamber 226, a pumping system 227, and a gas feed system 228. The foregoing apparatus is defective not only in that difficulty is experienced in wiring for DC voltage application, but also in that the etching characteristics for substrates 220 vary from substrate to substrate because of influences thereon of slight structural and like differences between the plurality of the substrate beds 214 provided on the RF electrode 213 as shown in FIG. 2.

Further, in the case of either type of the conventional apparatuses having the aforementioned respective structures as shown in FIGS. 1 and 2, even if the electrode(s) 102, 217 can be covered with the dielectric film(s) 105, 215 perfectly in close contact relation, the dielectric film(s) 105, 215 would deteriorate during dry etching. This requires frequent replacement of the dielectric film(s) 105, 215 with a new dielectric film(s), which presents an additional problem of large losses of time and labor needed for such replacement. Even when the dielectric film(s) 105, 215 is adhered to the electrode(s) 102, 217, whether or not the adhesion of the dielectric film(s) 105, 215 to the electrode(s) 102, 217 can withstand practical use cannot be estimated before an actual trial of a dry etching operation in vacuum, and the probability of successful adhesion is low. Therefore, it is problematic to adopt these dry etching apparatuses in actual large-scale integrated circuit production lines.

The present invention has been made with a view to solving the foregoing problems. Accordingly, an object of the present invention is to provide a novel dry etching apparatus wherein a substrate bed(s) having a comparatively simple structure and dielectric members are assembled into an RF electrode structure capable of sufficiently strong, electrostatically chucking of a substrate(s) on the substrate bed(s) and at the same time stably and sufficiently cooling the substrate(s) during dry etching to thereby effect the etching of the substrate(s) with excellent uniformity and reproducibility.

SUMMARY OF THE INVENTION

In order to attain the above-mentioned object, the present invention provides a dry etching apparatus comprising a vacuum chamber equipped with means for feeding thereinto a gas such as a reactive gas and provided therein with an RF electrode, to which a radio frequency voltage is to be applied and on which an object substrate(s) is placed, and a grounded electrode, a plasma being generated from the reactive gas between the RF electrode and the grounded electrode to etch the substrate(s) therewith;

(a) wherein the entire surface, facing the plasma, of the RF electrode is covered with a substrate bed(s) and detachable dielectric members;

(b) wherein the substrate support(s) comprises a dielectric portion having a surface for placing thereon a substrate and a conductive portion provided just under the dielectric portion and being equipotential in terms of direct current to the RF electrode;

(c) wherein a gap extension(s) constituted of a gap(s) between the dielectric members, a gap(s) between the dielectric members and the substrate support(s), etc. and ranging from the above-mentioned surface of the RF electrode to the space of the plasma is so zigzag dimensioned in cross section perpendicular to the RF electrode that the space of the plasma cannot structurally be viewed from the above-mentioned surface of the RF electrode; and (d) wherein the RF electrode is provided with means for applying thereto through a radio frequency filter a negative DC voltage having a larger absolute value than that of a negative self-bias voltage induced by plasma discharge during radio frequency power supply.

In the dry etching apparatus of the present invention having the foregoing structure, since the conductive portion(s) [i.e., the main body (bodies) of the substrate support(s)] surrounded by the dielectric portion(s) serves as an electrostatic chucking electrode(s) which is equipotential in terms of direct current to the RF electrode, no particular lead wire or the like for applying therethrough a DC voltage to the main body (bodies) of the substrate bed(s), as the electrostatic chucking electrodes, are needed. Accordingly, it is suffice to apply a DC voltage directly to the RF electrode for electrostatic chucking. This permits the structure of the dry etching apparatus to be simplified.

Further, since the value of ionic current is characteristically saturated at a low level no matter how much the absolute value of the negative DC voltage applied to the RF electrode may be raised, a sufficiently high voltage can be applied, through the dielectric portion(s), between the substrate(s) and the conductive portion(s) positioned just under the dielectric portions of the substrate bed(s) to make a large electrostatic chucking force available.

Additionally stated, attraction between the substrate(s) and the substrate supports(s) works only during a dry etching operation just as in the case of conventional apparatuses to facilitate attachment and detachment of the substrate before and after, respectively, the dry etching operation.

The structure of the dry etching apparatus of the g present invention does not allow "electrons" to flow in direct current fashion or mode from the plasma into the RF electrode not only because the surface of the RF electrode is perfectly covered with the detachable dielectric members and the substrate support(s) having a dielectric portion having a surface for placing thereon a substrate—while the gap extension(s), or gap continuum(s), constituted of a gap(s) between the dielectric members, a gap(s) between the dielectric members and the substrate bed(s), etc.—is crooked (i.e., zigzag) in cross section perpendicular to the RF electrode, but also because the negative DC voltage applied to the RF electrode has a larger absolute value than that of the negative self-bias voltage induced in the substrate(s) during discharge Although "ions" instead of electrons into flow in a direct current fashion into the RF electrode, the amount of ionic current flowing thereinto is greatly suppressed because the gap extension(s) as a path(s) of ions is zigzagged in cross section perpendicular to the RF electrode. The extent of such suppression is by far larger than that in the case of electric current. This suppressive effect is greater as the number of zigzags is set to be larger. Even if the flow of ions into the RF electrode occurs, the amount of ionic current flowing thereinto is suppressed to at most a few mA/cm2 as will be described later. Such a slight amount of leakage current does not influence a power source for electrostatic chucking to affect the self-bias voltage during dry etching.

When an attachable and detachable dielectric ring(s) having a smaller inner circumference and a larger circumference than the outer circumference of a substrate is fitted around the protruding portion(s), if provided, of the substrate bed(s) on which the substrate(s) is placed, the very thin dielectric portion(s), or film(s), (for electrostatic chucking) constituting the upper surface portion(s) of the substrate bed(s), in particular, is prevented from being etched and hence being shortened in life span, while the work of setting a plurality of zigzags in the gap extension(s) is greatly facilitated.

BRIEF DESCRIPTION OF THE DRAWINGS

The foregoing and other objects and advantages of the present invention will be better understood by reference to the description, taken in conjunction with the accompanying drawings, in which.

PREFERRED EMBODIMENTS OF THE INVENTION

A description will now be made of the preferred embodiments of the present invention while referring to the accompanying drawings, which are schematic to such an extent as to at least make the present invention understandable.

Figure 1:
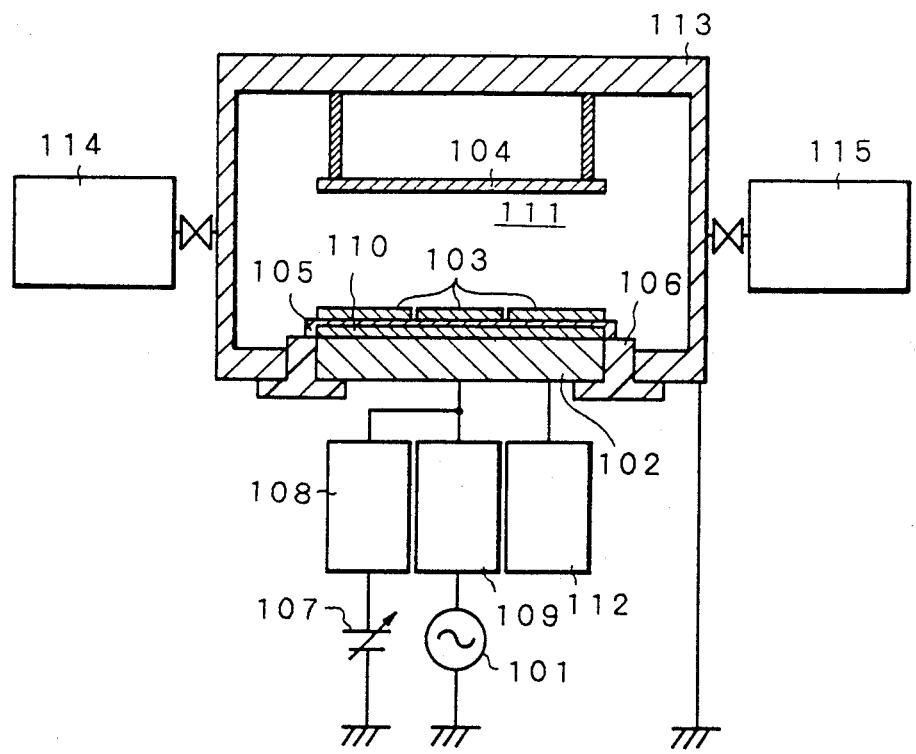
FIGS. 1 and 2 are cross-sectional views of conventional dry etching apparatuses.
Figure 2:
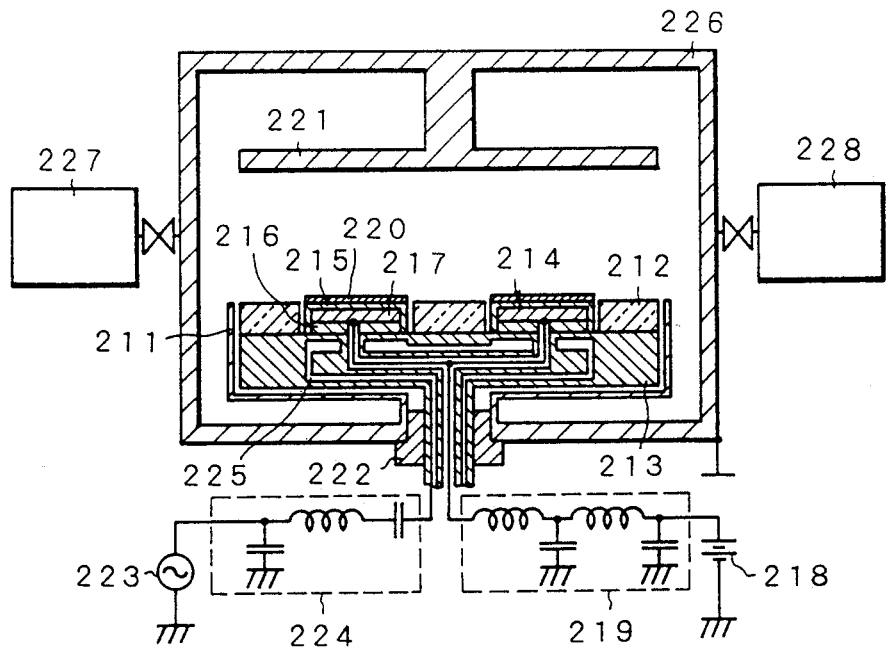
Figure 3:
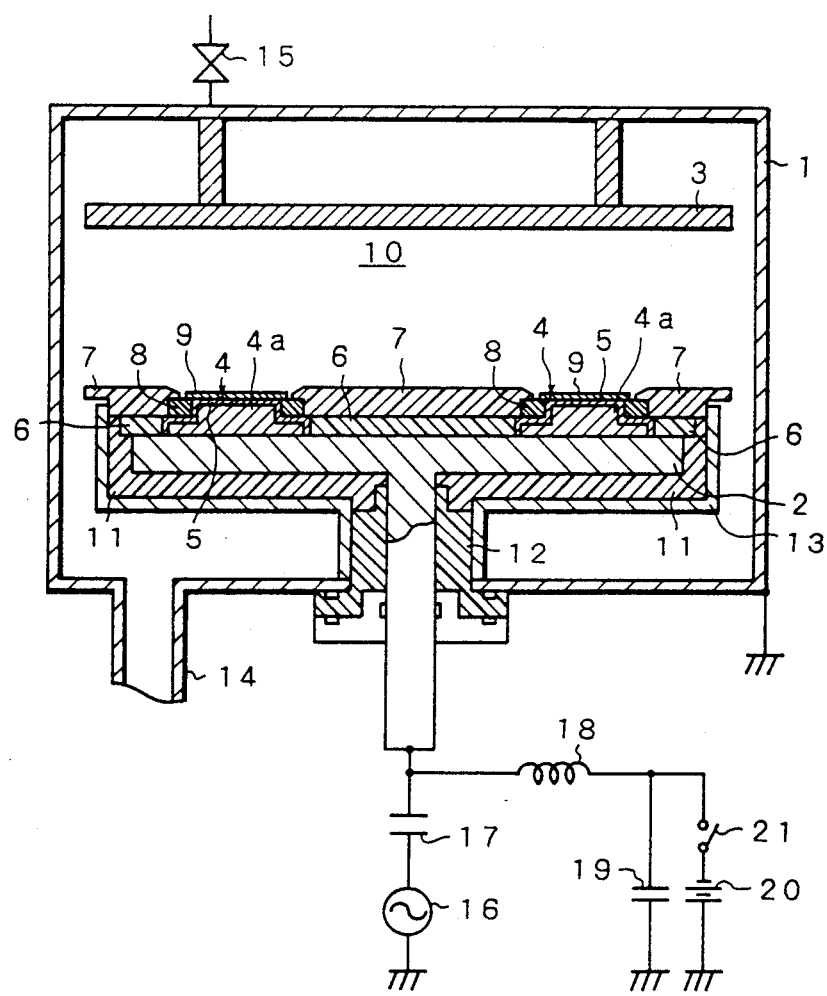
FIG. 3 is a schematic cross-sectional view of the essential structure of an example of the reactive ion etching apparatus of the present invention.

FIG. 3 is a schematic front cross-sectional view of the an example of the reactive ion etching apparatus of parallel flat plate type according to the present invention. This apparatus comprises a grounded vacuum chamber 1 wherein an RF electrode 2 and a grounded counter electrode 3 are disposed in such a way as to have the respective electrode surfaces thereof parallel with each other.

A plurality of the main bodies 4a of convex substrate beds (substrate supports) 4 which bodies are made of aluminum are mounted on the upper surface of the RF electrode 2. Object substrates 9 to be subjected to an etching treatment are placed on the upper surfaces of the protruding portions of the convex substrate supports 4 (and thereby superposing over RF electrode 2) to cover the protruding portions. The areas of the upper surfaces of the protruding portions are so much smaller than those of the substrates 9 that the protruding portions are completely covered over by substrates 9.

The bottom surfaces of the main bodies 4a of the substrate supports 4 are in direct (also electrical) contact with the RF electrode 2. The surfaces of the main bodies 4a of the substrate supports 4 other than the bottom surfaces thereof are totally covered with respective polyimide film 5 having a thickness of 25 μm. In this example, the substrate supports 4 are constituted of the respective main bodies 4a thereof and the respective polyimide films 5. Accordingly, the substrates 9 are, in effect, respectively placed on the polyimide films 5.

The upper surface of the RF electrode 2 except for the areas thereof in contact with the substrate supports 4 is covered with dielectric members, namely a first dielectric cover 6 and a second dielectric cover 7 in this example. The two dielectric covers 6 and 7 as well as the substrate supports 4 can be easily detached from the RF electrode 2 by raising them upwardly. In other words, they are attachable to and detachable from the RF electrode 2 to provide a construction easy to assemble and dismantling.

Dielectric rings 8, like the other dielectric members, are respectively fitted around the protruding portions of the substrate supports 4. The peripheral portions of the substrates 9 other than those in contact with the substrate supports 4 are respectively located on the dielectric rings 8. Also, the dielectric rings 8 are attachable to and detachable from around the protruding portions of the substrate supports 4 having the respective main bodies 4a covered with the respective polyimide films 5. The detachment of the dielectric rings 8 can be easily done by pulling them upwardly. The inner diameters of the dielectric rings 8 are a little smaller than the diameters of the substrates 9, while the outer diameters of the dielectric rings 8 are a little larger than the diameters of the substrates 9. Accordingly, when assembling is completed and the substrates 9 have been placed on the substrate supports 4, the polyimide films 5 of the substrate supports 4 are completely covered with the corresponding substrates 9, dielectric rings 8, and first and second dielectric covers 6 and 7.

Each of the thus formed gap extensions when the first and second dielectric covers 6 and 7, the dielectric rings 8, and the substrate supports 4 are assembled together has at least two zigzags as viewed in a cross-sectional view (four zigzags in FIG. 3) to provide such the structure that the plasma space 10 cannot be viewed from the RF electrode 2. Each of the gap extensions ranging from the upper surface of the RF electrode 2 to the plasma space 10 includes a gap between the dielectric cover 6 and the polyimide film 5, a cap between the dielectric covers 6 and 7, a gap between the dielectric ring 8 and the polyimide film 5, a gap between the dielectric ring 8 and the dielectric cover 7, and a gap between the substrate 9 and the dielectric ring 8. Since the substrate supports 4 are convex, the gap extension comprising those gaps run, not straight but zigzag, from the upper surface of the RF electrode to the plasma space 10 as shown in FIG. 3.

The side face and reverse surface of the RF electrode 2 are covered with a shield panel 13 with dielectric spacers 11 and 12 provided therebetween, which are not required to be detachable.

A description will now be made of how the apparatus having the foregoing structure operates, taking as an example a case of silicon trench etching wherein fine grooves and/or holes are formed in a silicon substrate.

The vacuum chamber 1 is evacuated to a high degree of vacuum by means of a vacuum pump (not shown in FIG. 3) connected with an evacuation pipe 14. Subsequently, a gas feed valve 15 is opened to feed a gas containing $SiCl_4$ into the vacuum chamber 1 till the pressure therein is raised to 15 mTorr.

Figure 6:
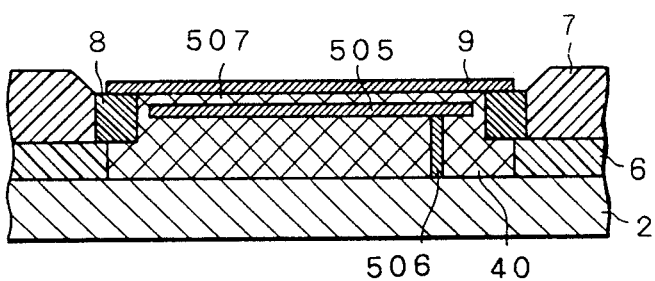
FIG. 6 is a cross-sectional view of a structure, around a substrate bed, of another example of the dry etching apparatus of the present invention.

While cooling the RF electrode 2 with a circulating cooling medium (while not shown in FIG. 3, the same structure as shown in FIG. 6 is adoptable for effecting the cooling), a radio frequency power of 13.56 MHz and 1,000 W is supplied from a radio frequency power source 16 through a blocking condenser 17 to the RF electrode 2. A switch 21 is turned on to apply a negative DC voltage of 2 kV from a DC power source 20 through a high-frequency filter comprising a coil 18 and a condenser 19 to the RF electrode 2 simultaneously with the supply of the radiofrequency power.

The supply of the radio frequency power causes discharge through the gas containing $SiCl_4$ to generate a plasma in the plasma space 10. This gives the substrates 9 a negative self-bias voltage of about 500 V (having an absolute value lower than that of the above-mentioned negative DC voltage), by which ions are attracted from the plasma to the substrates 9, which are subjected to reactive ion etching (RIE) through an interaction of those ions and active radicals formed by the plasma with the substrates 9.

When the foregoing is in process, a potential difference arises between the substrates 9 and the main bodies 4a of the substrate supports 4 with the polyimide films 5 of 25 μm in thickness sandwiched therebetween.

When the negative DC voltage applied from the DC power source 20 to the RF electrode 2 is increased in absolute value to about −1.5 kV which is a negative DC voltage 1 kV more negative than the negative self-bias voltage (about −500 V) induced in the substrates 9, the substrates 9 are electrostatically attracted so much more tightly to the substrate support 4 that the substrates 9 can be efficiently cooled due to heat dissipation therefrom through the substrate supports 4 to the RF electrode 2.

Since the potential of the RF electrode 2 and the main bodies 4a of the substrate supports 4 is considerably more negative than the self-bias potential, no "electronic current" flows through the gaps between the dielectric members 6, 7 and 8 and between the substrate supports 4 and the dielectric members 6, 7 and 8 which are assembled together to cover the upper surface of the RF electrode 2. This perfectly does away with dielectric breakdown of the dielectric portions 5 and the dielectric members, which would otherwise be affected by an excessive electronic current as in the conventional apparatuses.

Instead, however, ions in the plasma flow through the above-mentioned gaps into the RF electrode 2. As shown in the probe-in-plasma characteristic curve of FIG. 4 (the details thereof will be described later), such an "ionic current" is saturated at a level of one several-hundredth to one several-thousandth of an electronic current at a voltage in practical service (in FIG. 4, "p" refers to a voltage in practical service in the case of ionic current in this example of the present invention, while "q" refers to the voltage in practical service in the case of the electronic current in the conventional apparatuses). Therefore, the dielectric portions and the dielectric members do not undergo dielectric breakdown, which would otherwise be caused by an overcurrent. Furthermore, the gap extensions which comprise the above-mentioned gaps between the dielectric members and between the substrate beds and the dielectric members, and which would otherwise allow the ionic current to pass therethrough is zigzagged to thereby suppress the flow therethrough of the ionic current and prevent the occurrence therein of discharge. Moreover, it was experimentally confirmed that the ionic current can be reduced to a negligible level when zigzags are provided in a plurality of places of each of the gap extensions.

Figure 4:
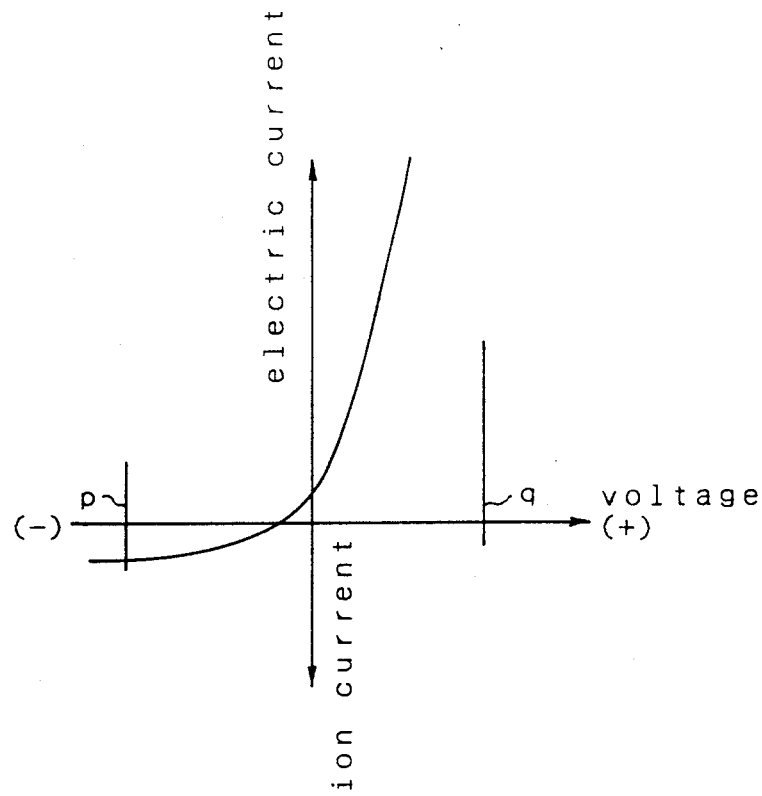
FIG. 4 is a graph showing a probe-in-plasma voltage electric current characteristic curve.
Figure 5:
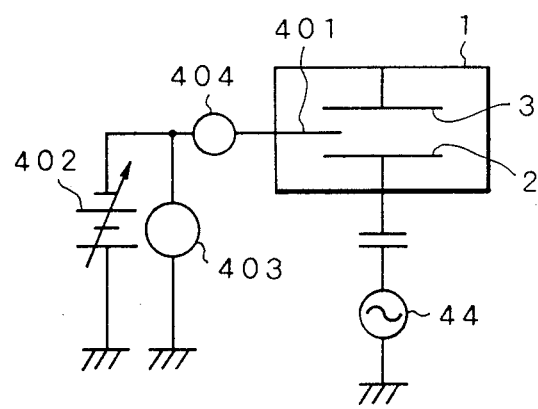
FIG. 5 is a diagram illustrative of how to make a measurement to obtain the graph of FIG. 4.

A description will now be made of the above-mentioned probe-in-plasma characteristic curve of FIG. 4, which was drawn by plotting the readings of a voltmeter 403 and an ammeter 404 when the DC voltage applied from a power source 402 to a probe 401 was varied in an etching apparatus of parallel flat plate type as schematically illustrated in FIG. 5 wherein the probe 401 was inserted in a plasma generated by a radio frequency power supplied from a radio frequency power source 44 in a space between an RF electrode 2 and a counter electrode 3 in a chamber 1.

As is apparent from the probe-in-plasma characteristic curve of FIG. 4, the electric current (ionic current) is saturated immediately in the region of negative probe voltages, and the electric current flowing into the probe at a voltage in practical service ("p" in FIG. 4) is as low as about one several-hundredth to one several-thousandth of that (electronic current) at a voltage in practical service ("q" in FIG. 4) in the region of positive probe voltages. This phenomenon, which was experimentally found by the inventors of the present invention, is utilized in the present invention.

FIG. 6 is a front cross-sectional view of a structure, around a substrate bed 4, of another example of the dry etching apparatus of the present invention. In FIG. 6, the same numerals as in FIG. 3 denote parts having the same functions as those of the parts in FIG. 3. Thus, a detailed description of such parts is omitted. In FIG. 6, numeral 40 refers to the substrate bed used in this example.

A major structure of the substrate bed 40 is made of a ceramic material to constitute a dielectric member. A metallic film electrode 505 as a conductive portion is embedded in the substrate support 40 under a substrate 9 at a depth of several tens to several hundreds μm from the upper surface of the substrate support 40, and is electrically connected through a connecting conductor 506 running through a through-hole with an RF electrode 2. Therefore, also in this case, the potential of the metallic film electrode 505 is the same in terms of direct current as that of the RF electrode 2. A ceramic portion between the substrate 9 and the metallic film electrode 505 constitutes a dielectric film portion 507.

A dielectric ring 8, and first and second dielectric covers 6 and 7 which are all detachable dielectric members are disposed around the substrate bed 40 to prevent the RF electrode 2 from being exposed to a plasma. The dielectric ring 8 having an inner diameter smaller than the diameter of the substrate 9 and an outer diameter larger than the diameter of the substrate 9 is disposed around the periphery of the protruding portion of the substrate support 40 to protect the dielectric film portion (ceramic) 507 constituting a very thin surface portion of the substrate support 40 on the upper side of the metallic film electrode 505 to thereby prolong the life span of the dielectric film portion 507.

Figures 7A, 7B:
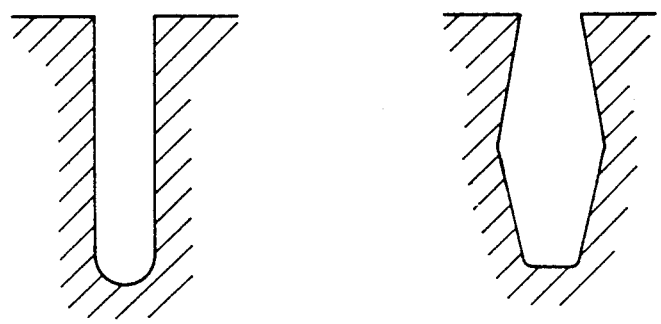
FIG. 7(a) is a cross-sectional view of a trench formed by silicon trench etching with an example of the dry etching apparatus of the present invention.
FIG. 7(b) is a cross-sectional view of a trench formed by silicon trench etching with the same apparatus as used in the formation of the trench of FIG. 7(a), but without effecting electrostatic chucking.

FIGS. 7(a) and 7(b) show cross-sectional contours of trenches of 1.0 μm in width and 4.5 μm in depth formed by etching respective silicon substrates each having thereon an SiO$_2$ mask by means of a dry etching apparatus. FIG. 7(a) is a reproduction diagram of a scanning electron microscope photograph of a trench formed by etching a silicon substrate using the apparatus of FIG. 3 according to the aforementioned example of the present invention wherein the silicon substrate was attracted by electrostatic chucking to the substrate support 4 cooled to 10° C. As is apparent from this diagram, the trench was formed without side etching to have an ideal shape having a vertical side wall and a round bottom. FIG. 7(b) is a reproduction diagram of a scanning electron microscope photograph of a trench formed by etching a silicon substrate under substantially the same conditions as in the formation of the trench shown in FIG. 7(a) except for nonuse of electrostatic chucking. The trench had a shape having a recessed side wall, namely a so-called bowing shape. The latter etching method provided irregular trench shapes with a large lot-to-lot variation to prove itself unusable in practical production of VLSI devices.

While the foregoing examples are concerned with the cases where the present invention is applied to a batch type apparatus wherein a plurality of substrates are subjected to one operation of an etching treatment, the application of the present invention is not limited only to such a batch type apparatus, but the present invention can, needless to say, be applied effectively to a one-by-one type apparatus wherein a single substrate is subjected to one operation of an etching treatment.

Needless to say, the material of the dielectric portion(s) or dielectric film(s) to be used in the present invention are not limited to a polyimide or a ceramic material, and anodized aluminum. Furthermore, aluminum or other conductive material like a metal can be used as the material of the conductive portion(s) in the present invention. Also, the thickness of the dielectric portion(s) or dielectric film(s), the dielectric members, and the electrodes are not restrictive.

The application of the present invention is not limited to a reactive ion etching apparatus, and the present invention can be applied satisfactorily to other types of dry etching apparatuses.

According to the present invention, dry etching can be effected while a substrate is sufficiently and strongly electrostatically chucked onto a substrate bed. Accordingly, sufficient cooling of the substrate can be efficiently effected with the temperature of the substrate being stable. This realizes a dry etching apparatus capable of etching substrates with excellent uniformity and reproducibility.

What is claimed is:

1. A dry etching apparatus, comprising:
    a vacuum chamber;
    means for introducing a reactive gas into said vacuum chamber;
    a first electrode provided within said vacuum chamber;
    a second electrode provided within said vacuum chamber in substantially spatial parallel relationship with said first electrode;
    at least one to be processed substrate being superposed over said first electrode;
    means for applying electrical power to said first electrode for generating a plasma from said reactive gas in a space in said vacuum chamber between said first and second electrodes to etch said substrate, said plasma inducing a negative self-bias voltage in said substrate;
    means including at least one substrate support and dielectric members, there being gaps between said substrate support and dielectric members, and between individual dielectric members, said substrate support and dielectric members being provided for completely covering a surface of said first electrode opposed to said second electrode;
    wherein said substrate support includes:
        a dielectric portion having a surface for accepting said substrate; and
        a conductive portion provided below said dielectric portion having the same electrical potential as said first electrode;
    wherein at least one gap extension is defined by said substrate support and dielectric members and extends along at least one of the gaps between said dielectric members and along at least one of the gaps between one of said dielectric members and said substrate support, said gap extension zigzagging from said surface of said first electrode to said plasma space such that, irrespective of the dimensions of said substrate, said plasma space cannot be viewed from said surface of said first electrode; and
    means for applying a negative biasing voltage having a larger absolute value than said negative self-bias voltage in said substrate to said first electrode;
    whereby said substrate is electrostatically attracted tightly to said substrate support to promote efficient heat transfer between said substrate and said first electrode.

2. A dry etching apparatus as claimed in claim 1, wherein said gap extension zigzags through a plurality of gaps to travel in a substantially perpendicular path from said first electrode to said 3. A dry etching apparatus as claimed in claim 1, wherein said substrate support has a protruding portion on which a substrate is to be placed, and around which a detachable dielectric ring having a smaller inner circumference and a larger outer circumference than the circumference of said substrate is provided as a dielectric member.

4. A dry etching apparatus as claimed in claim 1, wherein said substrate support comprises a convex conductive portion and a dielectric portion provided on all surfaces of said convex conductive portion except for a surface in contact with said first electrode.

5. A dry etching apparatus as claimed in claim 1, wherein said substrate support comprises said dielectric portion being made of a ceramic material and said conductive portion embedded in said ceramic material in the proximity of but spaced apart from said substrate accepting surface and electrically connected to said first electrode.

* * * * *

UNITED STATES PATENT AND TRADEMARK OFFICE
CERTIFICATE OF CORRECTION

Page 1 of 2

PATENT NO. : 4,968,374
DATED : November 6, 1990
INVENTOR(S) : Tsutomu Tsukada, et al.

It is certified that error appears in the above-identified patent and that said Letters Patent is hereby corrected as shown below:

In the Abstract, line 16, after "irrespective" insert --of-- and change "dimesions" to --dimensions--.

Column 1, line 17, after "circuits" insert --.--.

Column 2, line 24, after "above" insert --.--;
         line 28, after "110" insert --is--;
         line 30, delete "a".

Column 3, line 18, delete "of" and insert --due to-- therefor;
         line 19, delete "the" (second occurrence).

Column 4, line 40, change "supports(s)" to --support(s)--;
         line 45, delete "g";
         line 60, after "discharge" insert --.--;
         line 61, delete "into" and insert --would-- therefor.

Column 5, line 52, delete "the";
         line 53, after "of" (second occurrence) insert --the--.

Column 6, line 22, delete "dismantling" and insert --dismantle-- therefor;
         line 43, after "Each" insert --of--;
         line 47, delete "the" and insert --a-- therefor.

UNITED STATES PATENT AND TRADEMARK OFFICE
CERTIFICATE OF CORRECTION

PATENT NO. : 4,968,374

DATED : November 6, 1990

INVENTOR(S) : Tsutomu Tsukada, et al.

It is certified that error appears in the above-identified patent and that said Letters Patent is hereby corrected as shown below:

Column 6, line 52, delete "cap" and insert --gap-- therefor.

Column 7, line 38, delete "support" and insert --supports-- therefor.

Column 10, line 42, after "said" insert --plasma space--.

Signed and Sealed this

Twenty-eighth Day of April, 1992

Attest:

HARRY F. MANBECK, JR.

*Attesting Officer*  *Commissioner of Patents and Trademarks*